United States Patent [19]
Hsieh et al.

[11] Patent Number: 5,466,625
[45] Date of Patent: Nov. 14, 1995

[54] METHOD OF MAKING A HIGH-DENSITY DRAM STRUCTURE ON SOI

[75] Inventors: Chang-Ming Hsieh; Louis L. C. Hsu, both of Fishkill; Seiki Ogura, Hopewell Junction, all of N.Y.

[73] Assignee: International Business Machines Corporation, Armonk, N.Y.

[21] Appl. No.: 346,207

[22] Filed: Nov. 22, 1994

Related U.S. Application Data

[62] Division of Ser. No. 900,041, Jun. 17, 1992.
[51] Int. Cl.[6] ............................................. H01L 21/8242
[52] U.S. Cl. ........................ 437/52; 437/21; 437/60; 437/203; 437/919
[58] Field of Search .................... 437/47, 48, 52, 437/60, 203, 228, 235, 919, 21; 257/301, 302

[56] References Cited

U.S. PATENT DOCUMENTS

| | | | |
|---|---|---|---|
| 4,651,184 | 3/1987 | Malhi | 257/302 |
| 4,673,962 | 6/1987 | Chatterjee et al. | |
| 4,688,063 | 8/1987 | Lu et al. | |
| 4,689,871 | 9/1987 | Malhi | |
| 4,797,373 | 1/1989 | Malhi et al. | |
| 4,801,988 | 1/1989 | Kenney | |
| 4,898,837 | 2/1990 | Takeda et al. | |
| 4,969,022 | 11/1990 | Nishimoto et al. | |
| 4,985,368 | 1/1991 | Ishii et al. | |
| 5,021,852 | 6/1991 | Sukegawa et al. | |
| 5,283,456 | 2/1994 | Hsieh et al. | 257/347 |

FOREIGN PATENT DOCUMENTS

| | | |
|---|---|---|
| 63-50056 | 3/1988 | Japan . |
| 2199696 | 1/1987 | United Kingdom . |

OTHER PUBLICATIONS

"Capacitor For Single FET Memory Cell"; G. V. Clarke et al.; IBM Technical Disclosure Bulletin, vol. 17, No. 9, Feb. 1975; pp. 2579–2580.
"process to Make Self–Aligned Dynamic Random–Access Memory Cells"; A. Davis; IBM Technical Disclosure Bulletin, vol. 30, No. 8, Jan. 1988; pp. 327–328.
"High Density Vertical Dram Cell"; W. Hwang et al.; IBM Technical Disclosure Bulletin, vol. 29, No. 5, Oct. 1986; pp. 2335–2340.
"Static RAM Cell Structure"; D. Chin et al.; IBM Technical Disclosure Bulletin, vol. 28, No. 10; Mar. 1986; pp. 4320–4322.
"Capacitive Load FET Static RAM In Trench Technology"; IBM Technical Disclosure Bulletin, vol. 28, No. 8; Jan. 1986; pp. 3385–3386.
"A New Soft–Error Immune DRAM Cell With a Transistor On A Lateral Epitaxial Silicon Layer"; T. Kubota et al.; Microelectronics Research Laboratories; NEC Corporation; IEDM 87; 1987 IEEE; pp. 344–345.
"A New Five–Watt, Class A, Silicon Power Transistor"; P. Flaherty et al; 1958 IRE National Convention Record, Part 3; Electron Devices; pp. 77–83.
"Trench Transistor With Independent Gate Control"; Craig; IBM Technical Disclosure Bulletin, vol. 29, No. 3; Aug. 1986; p. 1028.

(List continued on next page.)

*Primary Examiner*—Tom Thomas
*Attorney, Agent, or Firm*—Whitham, Curtis, Whitham & McGinn; Harold Huberfeld

[57] ABSTRACT

A high density, DRAM cell array with a very short channel, vertical gate transfer transistor that can be manufactured using conventional photolithography process steps. The conventional four-by-four DRAM array shown schematically in FIG. 1a is rearranged to the shared-gate, double-bit array shown schematically in FIG. 1b. Trench storage capacitors and vertical FET transistors are arranged in pairs with a common vertical gate and a common substrate, allowing both bit and substrate contacts to be shared by adjacent cells.

3 Claims, 7 Drawing Sheets

OTHER PUBLICATIONS

"Flanged Trench Capacitor Cell"; R. E. Scheuerlein; IBM Technical Disclosure Bulletin, vol. 30, No. 5; Oct. 1987; pp. 410–411.

"Isolation Merged Stacked Dynamic Random–Access Memory Cell"; G. B. Bronner et al.; IBM Technical Disclosure Bulletin, vol. 31, No. 7; Dec. 1988; pp. 39–40.

METHOD OF MAKING A HIGH-DENSITY DRAM STRUCTURE ON SOI

This application is a divisional of co-pending application Ser. No. 07/900,041, filed on Jun. 17, 1992.

BACKGROUND OF THE INVENTION

FIELD OF THE INVENTION

This invention relates to an improved semiconductor structure for high-density, dynamic random access memory (DRAM) arrays, and more particularly, to a structure that can be implemented with a small feature size and is efficient in area utilization.

This application is related to U.S. patent application Ser. No. 07/900,038, filed Jun. 17, 1992, entitled "Vertical Gate Transistor With Low Temperature Epitaxial Channel" and assigned to the assignee of this application, which application issued on Feb. 1, 1994 as U.S. Pat. No. 5,284,456.

Because the conventional planar capacitor cell cannot achieve sufficient storage capacitance, various three-dimensional cell structures have been proposed in the prior art for producing mega-bit DRAMs. Cells using trench capacitors have been proposed in order to maintain sufficient storage capacitance. An article entitled "A New Soft-Error Immune DRAM Cell With a Transistor On a Lateral Epitaxial Silicon Layer (Tole Cell)", by T. Kubota et al., *IEEE Journal*, 1987, pgs. 344-347, discloses a DRAM cell with trench capacitors. This cell is produced by a silicon-on-insulator fabrication technology that combines epitaxial lateral overgrowth and preferential polishing to produce a cell with a conventional gate structure for each cell.

Figure 1A:
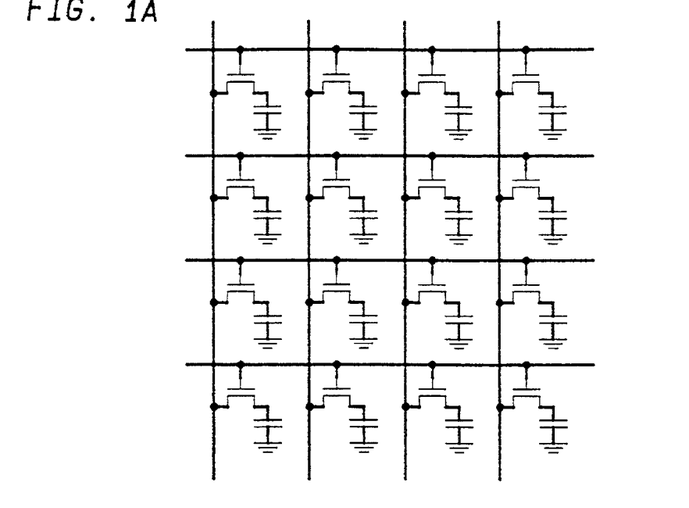
FIG. 1a and 1b are schematic drawings of DRAM cell arrays.

FIG. 1A is a schematic diagram of a conventional four-by-four array of dynamic random access (DRAM) cells.

Figure 1B:
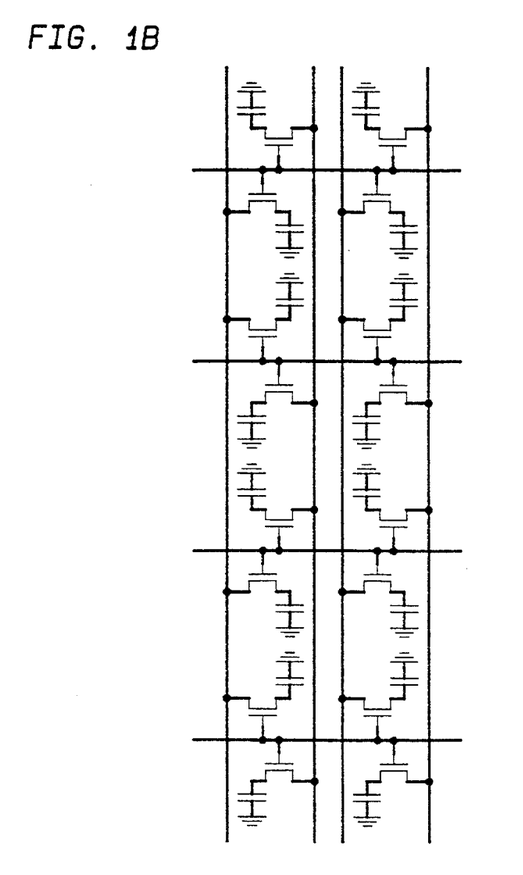

This conventional array can be rearranged to the shared-gate, double-bit array shown in FIG. 1B. This latter array layout can be implemented with a vertical gate FET described in the aforementioned co-pending application. It also allows both bit and substrate contacts to be shared by adjacent cells. In an effort to reduce the cost per memory cell, the state of the art in DRAM technology continuously seeks to increase the cell density per integrated circuit chip. This requires small feature size, preferably using conventional photolithography process steps, and efficient use of the semiconductor chip area.

SUMMARY OF THE INVENTION

An object of this invention is the provision of a high-density DRAM structure using a silicon-on-oxide wafer and conventional photolithographic process steps; a DRAM with a cell area on the order of three to four times the feature size (e.g., 1.5 µm² to 2.0 µm² cell area with a 0.5 µm feature size).

Another object of the invention is a DRAM cell that is relatively immune to soft errors that are caused by alpha particle and cosmic ray irradiation.

A further object of the invention is a DRAM structure where both the bit and substrate contacts are shared by adjacent cells.

Another object of the invention is to reduce bit-line capacitance by using the SOI wafer to improve DRAM speed. Furthermore, the use of a stacked capacitor in the trench, with its node plate uniquely connected to the device substrate, can greatly reduce trench capacitor leakage problems and result in longer charge-retention time.

Briefly, this invention contemplates the provision of a high density, DRAM cell array that can be manufactured using conventional photolithography process steps. The conventional four-by-four DRAM array shown schematically in FIG. 1a can be rearranged to the shared-gate, double-bit array shown schematically in FIG. 1b. Stacked trench storage capacitors and vertical FET transistors are arranged in pairs with a common vertical gate and a common substrate, allowing both bit and substrate contacts to be shared by adjacent cells.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
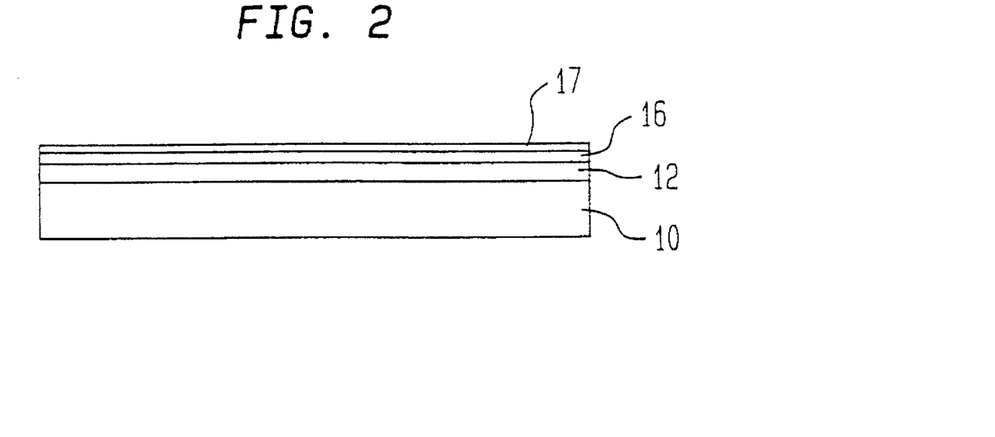
FIGS. 2 through 2K are sectional views of a cell in accordance with the teachings of this invention at various illustrative process stages.

Referring now to the drawings, starting with FIG. 2, the preferred starting point is a silicon-on-oxide wafer with an oxide layer 10, a thin silicon layer 12 supported by a semiconductor wafer (not shown). In this exemplary embodiment of the invention the silicon layer 12 is n doped. A layer 16 of thermal oxide 1000 Å thick is grown over the silicon surface, and a nitride layer 17 about 2000 Å thick is deposited on the surface of the oxide layer. It should be noted that in the following figures, some reference numerals that are repeated from one Figure to the next have been omitted in some of the Figures subsequent to their first introduction for the purposes of visual clarity.

Figure 2A:
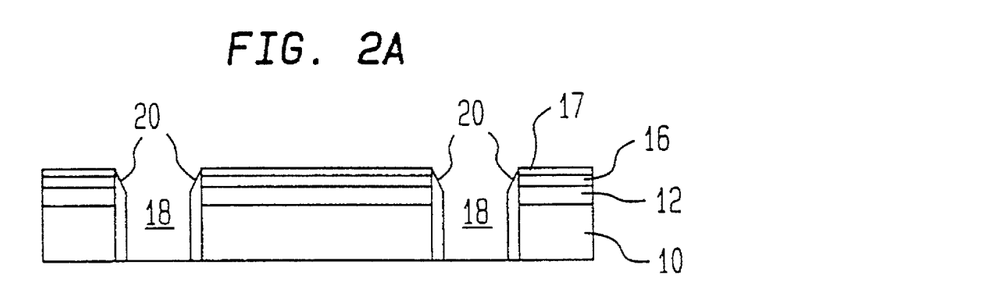
Figure 2B:
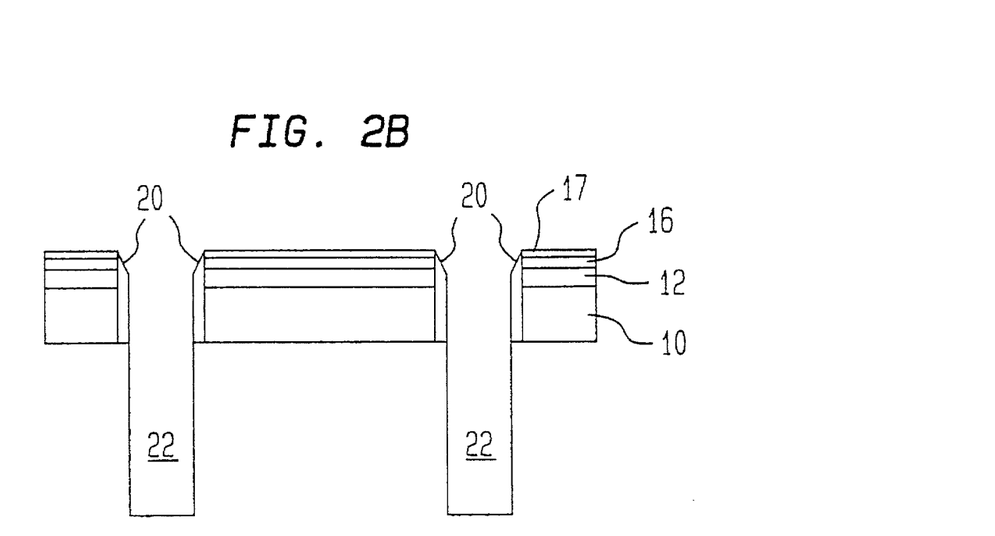

Referring now to FIG. 2A, a pattern of a trench used for cell capacitor is formed in a photo-resist (not shown) with a suitable lithography tool; the trench width is on the order of 0.8 µm (the dimension picked here is for an arbitrary design ground rule). The oxide/nitride layer 16, the silicon layer 12, and the oxide layer 10 are then etched to form openings 18, stopping at the surface of support wafer. The resist is then stripped. A nitride spacer 20, about 800 Å thick, is formed by a blanket deposited CVD nitride layer followed by reactive ion etching to leave only the spacer 20 on the sidewalls. The device after this reactive ion etch step is shown in FIG. 2A.

Next, trenches 22 are etched into the support wafer to a depth of about 0.5 µm by a reactive ion etching step using a $Cl_2/O_2$ plasma. Here, it should be noted that the etch rate of silicon is greater than ten times than the etch rate of silicon oxide and silicon nitride. A trench with these dimensions provides a capacitance on the order of 40 fF.

Referring now to the enlarged fragmentary drawings 2Ba through 2Bd. The left-hand side of one of the trench wall areas is shown in the enlarged view of FIG. 2Ba.

To provide a DRAM structure with an immunity to alpha particle radiation, and also to reduce leakage of storage charges, a layer of thermal oxide 24 about 1500 Å thick is grown on the trench sidewalls after they have been cleaned. The silicon layer 12 is covered by nitride spacer 20 and is not oxidized in this step as shown in FIG. 2B*b*.

The nitride spacer 20 is then stripped in a hot solution of $H_3PO_4$. FIG. 2B*c* shows the trench wall at this step.

Figure 2C:
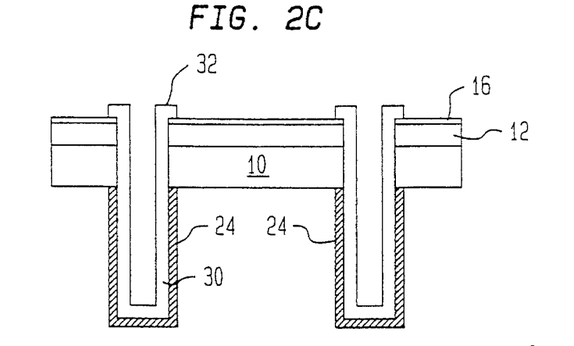

Next, a layer 30 of n+ doped polysilicon is deposited, lithographically patterned, and etched to form the capacitor node electrode. Here it should be noted that the layer 30 is connected to the silicon layer 12, which will become the source layer of the completed FET device. In situ doped polysilicon as well as ion implanted silicon can be used for layer 30. A composite capacitor oxide-nitride-oxide layer 32 is formed using a conventional technique (about 70 Å). FIG. 2B*d* shows a detail of the trench SOI area at this stage, and FIG. 2C shows the larger structure at this same state.

Figure 2D:
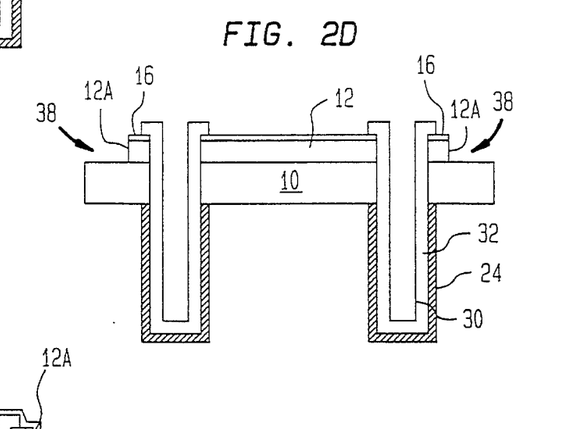

As can best be seen with reference to FIG. 2D, the silicon layer 12 is then patterned, and etched in the regions indicated by the general reference numeral 38, to form silicon islands upon which FET pairs are formed. Grow high-pressure-oxide 12A to seal the edge of the exposed silicon regions.

Figure 2E:
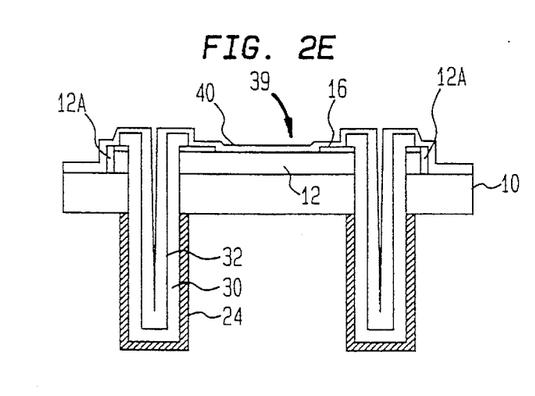

The oxide layer 16 is opened in the central region 39 between two trench capacitors where the vertical gate will be formed, and a layer 40 of n+ doped epitaxial silicon is formed, preferably by a low temperature epitaxial process. Alternatively, the layer 40 can be formed by recrystallizing deposited in situ doped amorphous silicon. Also, layer 40 can be formed by a lateral overgrowth epitaxial process. This layer 40, which covers the upper surfaces and trench walls of the device, serves both as a substrate plate electrode for the capacitor and as a channel layer in the completed device. The device at this state is shown in FIG. 2E and in fragmentary detail of the left corner of the trench capacitor in FIG. 2E*a*.

Figure 2F:
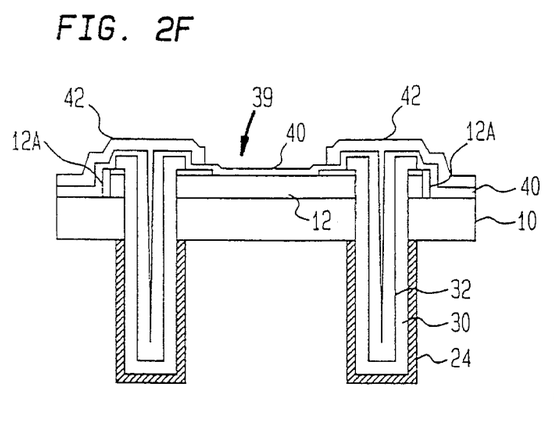
Figure 2G:
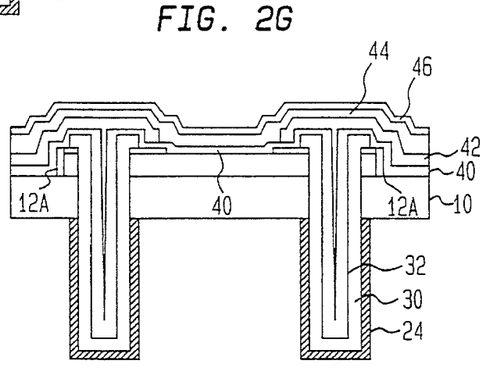

Next, a CVD oxide layer 42 is deposited, patterned to open the central gate region 39, and the patterned region opened. The device at this state is shown in FIG. 2F. A CVD layer 44 of n-type polysilicon, to form the drain, is then conformally deposited and an oxide layer 46 is grown on its surface. The device in this state is shown in FIG. 2G.

Figure 2H:
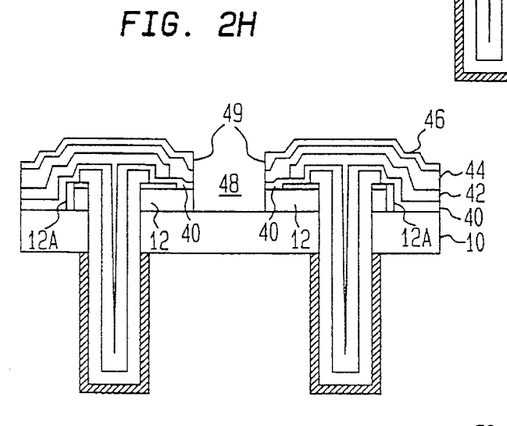

The oxide layer 46 is patterned, and an opening, indicated by the general reference numeral 48 in FIG. 2H, is etched through all the layers extending to the top surface of SOI burned oxide layer 10. A gate oxide 49 is grown as a thin oxide (about 65 Å, for example) on the wall of the opening 48.

Figure 2I:
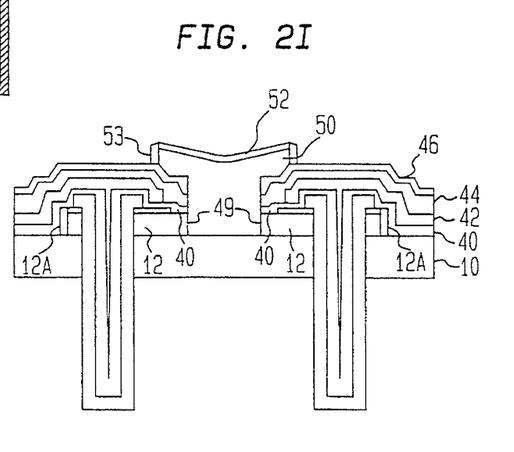
Figure 2J:
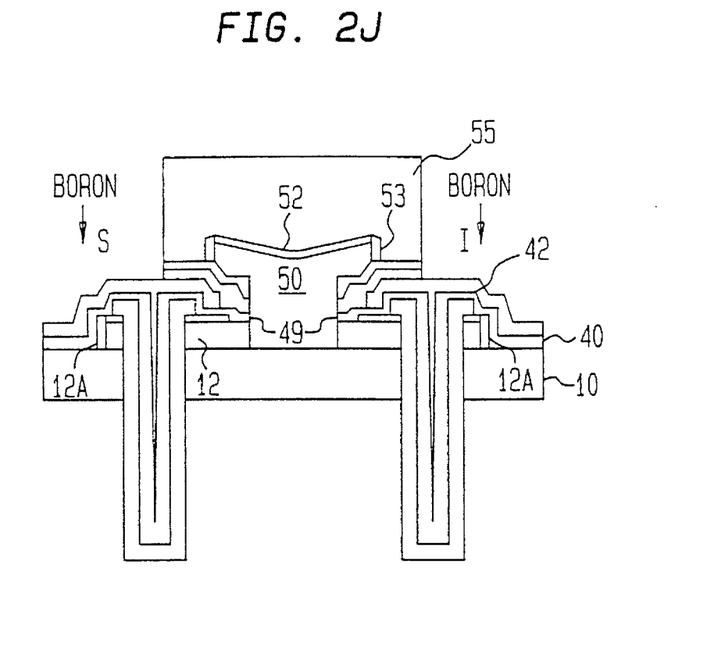

A gate stack 50 including a CVD deposit of n+ polysilicon, filling the opening 48 and extending up over the oxide layer 46, a thin oxide layer grows over the polysilicon and a thin nitride layer 52 is formed using conventional process steps. After gate stack material is attached to define the gate, the sidewalls 53 of the exposed gate structure are oxidized by a HIPOX process step. The structure of the completion of these process steps is shown in FIG. 2I. An ion implant step is performed at this stage to dope the gate and drain polysilicon regions with arsenic. A block-out resist 55 is applied and patterned, to define a drain contact area (which in the final DRAM cell is a bit-line contact), followed by a ion implant to dope the substrate area with boron to reduce substrate contact resistance. This step is illustrated in FIG. 2J. The resist 55 is removed and the exposed silicon walls oxidized (59) by a HIPOX step.

Since the substrate layer is common to all the cells, it is not necessary to have a contact to each cell. It can be arranged to make one substrate contact per every 128 bits (for example).

Figure 2K:
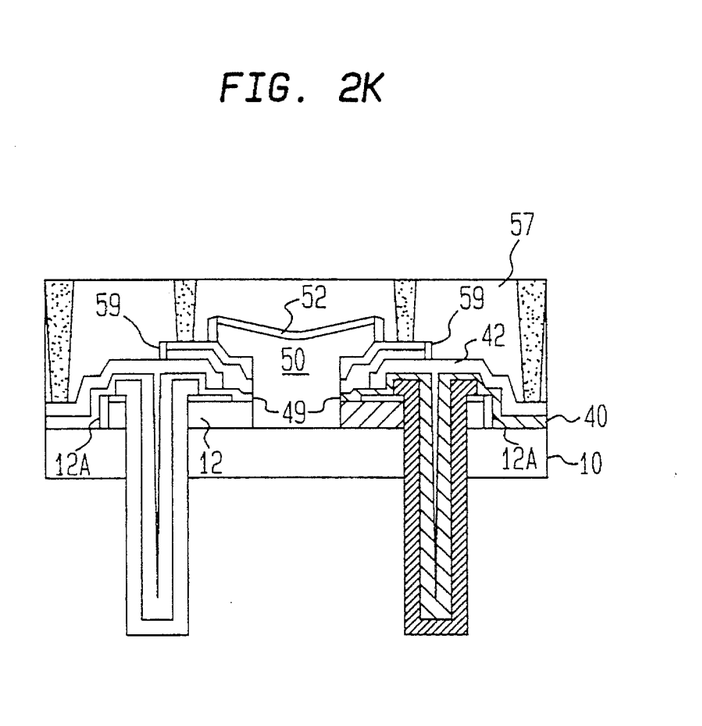

Using conventional process steps such as those described in more detail in the above-referenced co-pending application, source and substrate contact regions are formed, the structure is covered with a suitable dielectric 57, openings are made in the dielectric, contacts are formed in the dielectric and the upper surface is planarized. The completed structure is shown in FIG. 2K.

Figure 3:
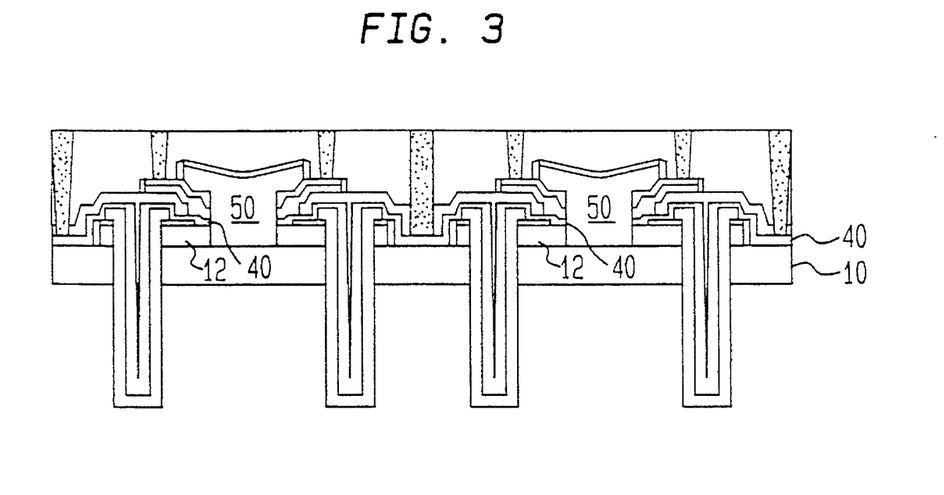
FIGS. 3 and 4 are schematic drawings of finished DRAM cells for both cross-sectional and plan view, respectively.
Figure 4:
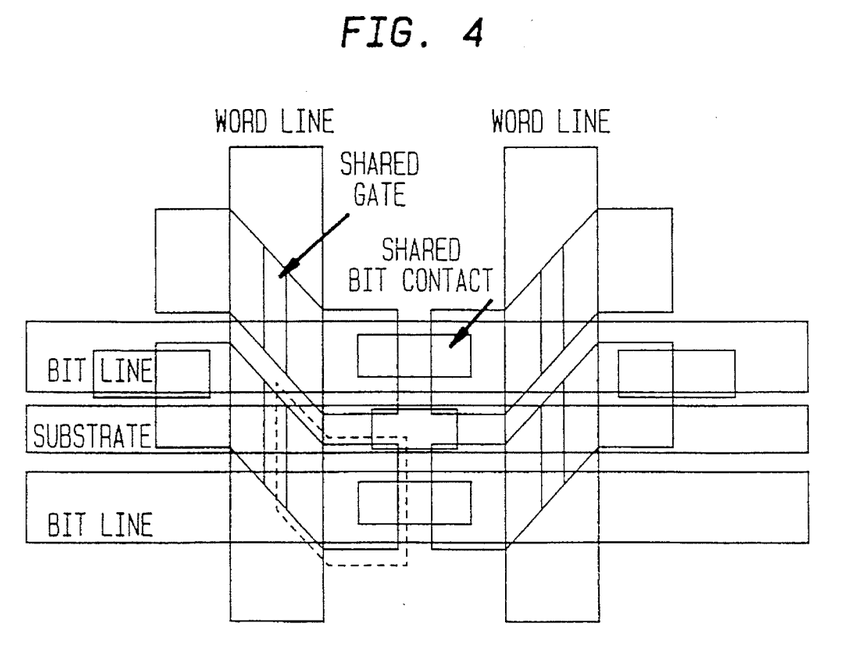

A cross-sectional view of a four-cell DRAM array is shown in FIG. 3 with a shared bit contact. FIG. 4 is a plan view of an exemplary layout for the cell array. As shown in FIG. 4, the word lines, polysilicon gate, are running in a vertical direction while bit lines, mostly metal, such as CVD tungsten, run in a horizontal direction. A suitable contact line is necessary for only every 128 cells. The dotted line indicates a single cell.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of forming a pair of integrated circuit, shared gate, cells for dynamic random access memories, comprising in combination:

patterning a silicon source layer on a silicon-on oxide wafer comprised of an oxide layer on the upper surface of an underlying support wafer;

etching a pair of capacitor trenches that extend through said patterned silicon source layer and said oxide layer and into said underlying support wafer;

conformally depositing a first capacitor plate layer on the wall of each of said pair of said capacitor trenches, said first capacitor plate layer extending to and connected with said silicon source layer;

forming a capacitor dielectric layer on said polysilicon capacitor plate layer;

forming an silicon channel layer conformally over said capacitor dielectric layer and overlying a region of said silicon source layer, said silicon channel layer forming a second capacitor plate and a channel layer;

forming a polysilicon drain layer overlying said silicon channel layer in said region where said silicon channel layer overlays said silicon source layer;

etching a vertical opening extending through silicon source layer, said silicon channel layer, and said polysilicon drain layer forming a pair of facing vertical wall surfaces in the region where the layers overlay one another with an edge in each layer respectively aligned vertically along said pair of facing vertical wall surfaces, said silicon channel layer extending from one of said facing wall surfaces forming the channel layer and the second capacitor plate layer for one cell of said pair of integrated circuit cells and said silicon channel layer extending from the other of said facing wall surfaces forming the channel layer and the second capacitor plate layer for the other cell of said pair of integrated circuit cells;

forming a gate dielectric covering said pair of facing vertical wall surfaces; and forming a vertical gate in said opening in contact with said gate dielectric.

2. A method of forming a pair of integrated circuit, shared gate, cells for dynamic random access memories as in claim 1, including the further steps of:

forming a substrate contact region in said silicon substrate layer common to said pair of integrated circuit cells; and forming a bit-line contact region in said polysilicon drain layer extending from said one of said facing wall surfaces.

3. A method of forming an integrated circuit cell for dynamic random access memories, comprising the steps of:

patterning a silicon source layer on a silicon-on-oxide wafer comprised of an oxide layer on the upper surface of an underlying support wafer;

etching a capacitor trench that extends through said patterned silicon source layer and said oxide layer and into said underlying support wafer;

conformally depositing a first capacitor plate layer on the wall of said capacitor trench, said first capacitor plate layer extending to and connected with said silicon source layer;

forming a capacitor dielectric layer on said first capacitor plate layer;

conformally forming an silicon channel layer over said capacitor dielectric layer and overlying a region of said silicon source layer, said silicon channel layer forming a second capacitor plate and a channel layer;

depositing a polysilicon drain layer overlying said silicon channel layer in said region where said silicon channel layer overlays said silicon source layer;

etching a vertical opening extending through silicon source layer, said silicon channel layer, and said polysilicon drain layer, said vertical opening forming a wall surface in the region where the layers overlay one another with an edge in each layer respectively aligned vertically along said wall surface;

forming a gate dielectric covering said wall surface; and forming a vertical gate in said opening in contact with said gate dielectric.

* * * * *

UNITED STATES PATENT AND TRADEMARK OFFICE
CERTIFICATE OF CORRECTION

PATENT NO. : 5,466,625
DATED : November 14, 1995
INVENTOR(S) : Hsieh, et al.

It is certified that error appears in the above-indentified patent and that said Letters Patent is hereby corrected as shown below:

In Column 1, line 20, after " U.S. Pat. No." please delete the numbers "5,284,456", and insert --5,283,456--.

Signed and Sealed this

Thirtieth Day of December, 1997

Attest:

BRUCE LEHMAN

Attesting Officer

Commissioner of Patents and Trademarks